United States Patent
Christ

(10) Patent No.: US 8,736,114 B2
(45) Date of Patent: May 27, 2014

(54) METHOD AND SYSTEM FOR ALIGNING CONDUCTORS FOR CAPACITIVE WIRELESS POWER TRANSMISSION

(75) Inventor: John Randall Christ, Santa Clara, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 302 days.

(21) Appl. No.: 13/248,116

(22) Filed: Sep. 29, 2011

(65) Prior Publication Data

US 2013/0082541 A1    Apr. 4, 2013

(51) Int. Cl.
*H02M 3/06* (2006.01)
*H04B 5/00* (2006.01)

(52) U.S. Cl.
CPC ............... *H04B 5/0012* (2013.01); *H04B 5/00* (2013.01); *H04B 5/0037* (2013.01); *H02M 3/06* (2013.01)
USPC .......................................................... 307/109

(58) Field of Classification Search
CPC ...... H04B 5/00; H04B 5/0012; H04B 5/0037; H02M 3/06
USPC .......................................................... 307/109
See application file for complete search history.

(56) References Cited

U.S. PATENT DOCUMENTS

| | | |
|---|---|---|
| 2009/0009174 A1 | 1/2009 | Forgang et al. |
| 2010/0087143 A1 | 4/2010 | Bonin |
| 2010/0109443 A1 | 5/2010 | Cook et al. |
| 2010/0285672 A1 | 11/2010 | Symons et al. |

OTHER PUBLICATIONS

Liu, Chao et al. "2-D Alignment Analysis of Capacitively Coupled Contactless Power Transfer Systems", IEEE Energy Conversion Congress and Exposition (ECCE), 2010.*
Kline et al., "Capacitive Power Transfer fo Contactless Charging", IEEE, 2011, pp. 1398-1404.

* cited by examiner

*Primary Examiner* — Hal Kaplan
(74) *Attorney, Agent, or Firm* — Buchanan Ingersoll & Rooney PC

(57) ABSTRACT

A method of aligning a wall conductor with an organic light emitting diode (OLED) panel conductor is disclosed. A transmitter device having a capacitive conductor and a receiver device having a capacitive conductor in proximity to the capacitive conductor of the transmitter device. The capacitive conductors of the transmitter device and the receiver device are aligned using an alignment indicator, which indicates that at least one edge of the capacitive conductor of the receiver device is in alignment with the capacitive conductor of the transmitter to optimize a transfer of power between the capacitive conductors.

22 Claims, 6 Drawing Sheets

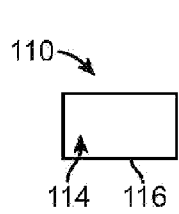 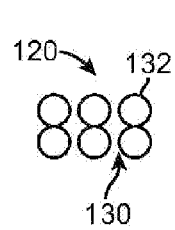 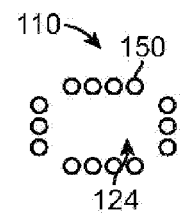 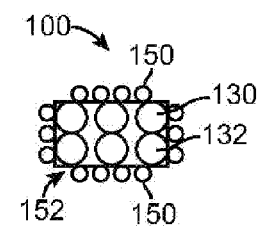
FIG. 4    FIG. 5    FIG. 6    FIG. 7
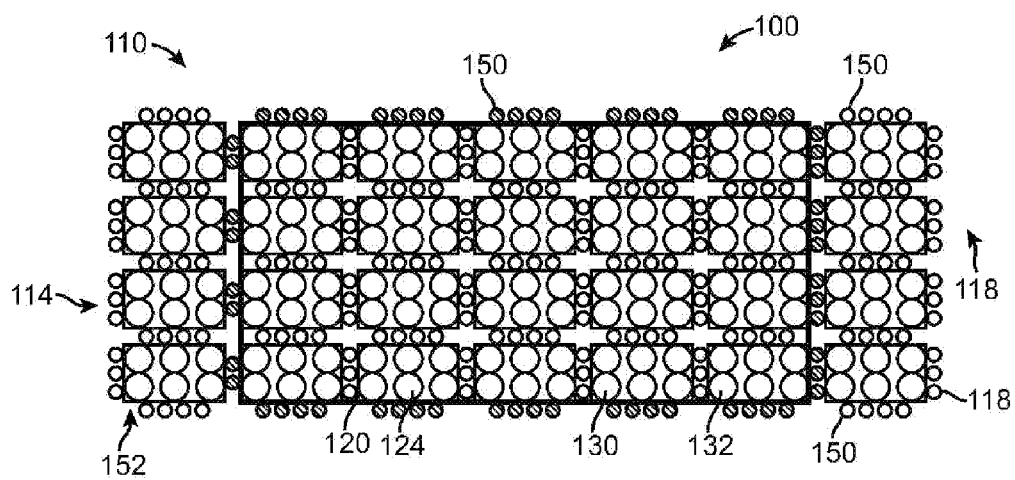
FIG. 8

METHOD AND SYSTEM FOR ALIGNING CONDUCTORS FOR CAPACITIVE WIRELESS POWER TRANSMISSION

FIELD OF THE INVENTION

The present invention relates to a method and system for aligning capacitive conductors for capacitive wireless power transmission, and more particularly to a system and method of aligning capacitive conductors and/or conductive plates to maximize the transfer of energy and/or a source of power from a transmitter panel to a receiver panel to optimize the transfer of power between the capacitive conductors and/or conductive plates.

BACKGROUND OF THE INVENTION

Wireless power transmission systems are being used to power and charge devices including personal data systems, phones, cameras, laptop computers, light sources, flat panel displays and the like. Most systems use an inductive, interface between a charging station, acting as a transmitter and a receiver, which receives the charge. The transmitter and the receiver are fitted with electrical coils, which when brought into physical proximity, power flows from the transmitter to the receiver.

Alternatively, a capacitive interface can be used between two capacitive conductors or conductive plates, which alleviates the need for magnetic flux guiding and shielding components that add bulk and cost to inductive solutions. However, one limitation of a capacitive interface is that the realizable amount of coupling capacitance is limited by the available area of the capacitive conductors. Accordingly, it would be desirable to have a system and method of aligning the conductors or panels to maximize the transfer of energy and/or source of power from the transmitter to the receiver.

SUMMARY OF THE INVENTION

In consideration of the above issues, a system and method of a system and method of aligning capacitive conductors and/or conductive plates to maximize the transfer of energy and/or a source of power from a transmitter panel to a receiver panel to optimize the transfer of power between the capacitive conductors and/or conductive plates is disclosed herein.

In accordance with an exemplary embodiment, a method of aligning a capacitive wireless power transmission system, the method comprises: providing a first one of a transmitter device having a capacitive conductor and a receiver device having a capacitive conductor; positioning a second one of the transmitter device and the receiver device in proximity to the capacitive conductor of the first one of the transmitter device and the receiver device; and aligning the capacitive conductors of the transmitter device and the receiver device using an alignment indicator, which indicates that at least one edge of the capacitive conductor of the receiver device is in alignment with the capacitive conductor of the transmitter to optimize a transfer of power between the capacitive conductors.

In accordance with another exemplary embodiment, a capacitive wireless power transmission system, comprises: a transmitter device having a capacitive conductor; a receiver device having a capacitive conductor in proximity to the capacitive conductor of the transmitter device; and an alignment indicator, which indicates that at least one edge of the capacitive conductor of the receiver device is in alignment with the capacitive conductor of the transmitter to optimize a transfer of power between the capacitive conductors.

In accordance with a further exemplary embodiment, a computer program product comprising a non-transitory computer usable medium having a computer readable code embodied therein for aligning a capacitive wireless power transmission system, the process comprises: providing a first one of a transmitter device having a capacitive conductor and a receiver device having a capacitive conductor; positioning a second one of the transmitter device and the receiver device in proximity to the capacitive conductor of the first one of the transmitter device and the receiver device; and aligning the capacitive conductors of the transmitter device and the receiver device using an alignment indicator, which indicates that at least one edge of the capacitive conductor of the receiver device is in alignment with the capacitive conductor of the transmitter to optimize a transfer of power between the capacitive conductors.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 4 is an illustration of transmitter device in the form of a wall conductor in accordance with an exemplary embodiment.

FIG. 5 is an illustration of a receiver device in the form of an OLED panel in accordance with an exemplary embodiment.

FIG. 6 is an illustration of the transmitter device in the form of a wall conductor having one or more indicators located around an outer edge or perimeter of the capacitive conductor of the transmitter device.

FIG. 7 is an illustration of an alignment configuration, wherein the wall conductor is aligned with the OLED panel conductors.

FIG. 8 is an illustration of an alignment configuration showing a wall conductor having a plurality of conductor panels and the OLED panel conductors are aligned within a center portion thereof.

DESCRIPTION OF THE PREFERRED EMBODIMENTS

Figure 1:
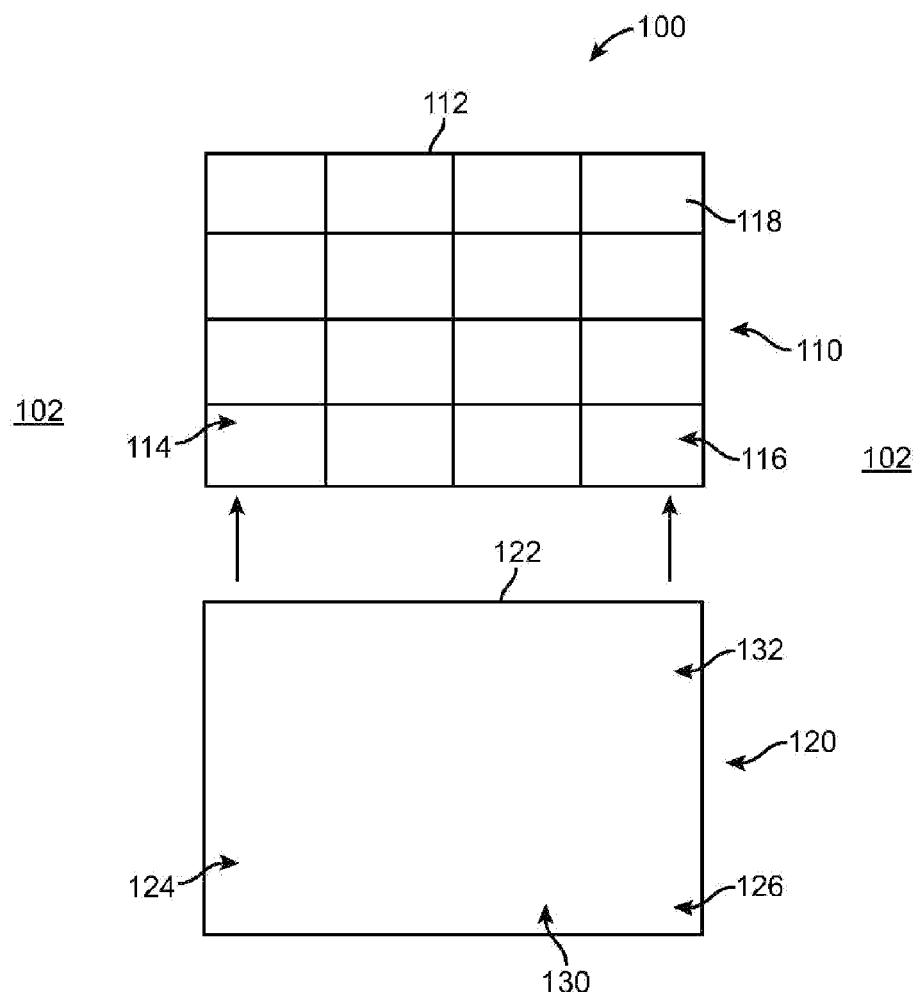
FIG. 1 is an illustration of a capacitive wireless power transmission system in accordance with an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is an illustration of a capacitive wireless power transmission system 100 in accordance with an exemplary embodiment. As shown in FIG. 1, the system 100 includes a transmitter device (or system) 110 having a capacitive conductor 114 and a receiver device (or system) 120 having capacitive conductor 124. The receiver device 120 receives a source of power (or energy) from the transmitter device 110 when the capacitive conductors 114, 124 are brought into physical proximity to one another.

In accordance with an exemplary embodiment, the transmitter device 110 is preferably a transmitter conductor panel 112 having a capacitive conductor 114. The capacitive conductor 114 is preferably in the form of a conductive plate 116. In accordance with an exemplary embodiment, the capacitive conductor 114 is a plurality of conductor panels 118. The transmitter device 110 has an electronic circuit (not shown) having a power source (e.g., alternating current (AC current), direct current (DC current) and/or batteries), which produces an electrical field, which delivers a source of power to the receiver device 120. The circuit is preferably relatively thin and comprised of electronically conductive pathways printed, painted or otherwise deposited on a thin, flexible substrate such as, for example, a film or polymeric web, e.g., circuit is a printed flexible circuit. In addition, to the power source, the circuit preferably also includes one or more electronic components which control the level, waveform shape, polarity, timing, etc. of the electric current applied by panel. For example, the circuit may contain one or more of the following electronic components: control circuitry such as a current controller (e.g., a resistor or a transistor-based current control circuit), an on/off switch, a central processing unit (CPU) and/or a microprocessor adapted to control the current output of the power source over time and determine the alignment of the capacitive conductors 114, 124 as set forth below.

The receiver system 120 is also preferably in the form of a receiver conductor panel 122 having a capacitive conductor 124. The capacitive conductor 124 is preferably in the form of a conductive plate 126, which when placed in physical proximity to the capacitive conductor 114 of transmitter conductor panel 112 receives a source of power or energy from the transmitter panel 112. The receiver conductor panel 122 is preferably a rectangular panel having an audio and/or a visual display associated therewith.

In accordance with an exemplary embodiment, the receiver device 120 is an organic light emitting diode (OLED) panel 130, which is comprised of a plurality of organic light emitting diodes 132. The OLED is a light-emitting diode (LED) in which the emissive electroluminescent layer is a film of organic compounds, which emit light in response to an electric current. The layer of organic semiconductor material is situated between two electrodes, the anode and cathode, which are deposited on a substrate. When an electric current is applied to the anode and the cathode (i.e., conductors 124) from the capacitive conductor 114 of the transmitter device 110, an electroluminescent light is produced from the organic material.

The OLED panel 130 can be a small display, or a component of a larger display, which can be used indoors and/or outdoors in store signs and billboards, destination signs on public transport vehicles or even as part of transparent glass area. Alternatively, the OLED panel 130 can be used as form of lighting, for the purpose of general illumination, task lighting, or even stage lighting rather than a display. Alternatively, the receiver device 120 may be any type of electric device that operates with consuming electric power conducted from the transmitter conductor panel 122.

In accordance with an exemplary embodiment, the receiver device 120 preferably includes a circuit (not shown), which is preferably a relatively thin and comprised of electronically conductive pathways printed, painted or otherwise deposited on a thin, flexible substrate such as, for example, a film or polymeric web, e.g., circuit is a printed flexible circuit. The circuit preferably also contains one or more of the following electronic components: control circuitry such as a current controller (e.g., a resistor or a transistor-based current control circuit), an on/off switch, and/or a central processing unit (CPU) or a microprocessor to display a visual image on the OLED panel 130.

In accordance with an exemplary embodiment, the transmitter device 110 is preferably a system or subsystem, which is attachable or mountable to a wall or wall-like structure 102. The placement of the receiver device 120 in physical proximity to the transmitter device 110 provides for the transfer of energy and/or a source of power from the transmitter device 110 to the receiver device 120. In accordance with an alternative embodiment, rather than having the transmitter device 110 being stationary and/or having a fixed location, the receiver device 120 can be stationary and the transmitter device 110 is positioned in proximity to the receiver device 120. In accordance with a further embodiment, neither the transmitter device 110 nor the receiver device 120 are stationary and/or fixed, such that either one or both of the devices 110, 120 are moveable and can be positioned in proximity to the other device 110, 120 as set forth herein.

In accordance with an exemplary embodiment, each of the capacitive conductors 114, 124 can have essentially any size or shape, whether square, oval, circular, or tailored for a specific use and/or design of the transmitter device 110 and/or receiver device 120. However, the capacitive conductors 114, 124 are preferably conductive plates 116, 126 have identical or nearly identical shapes to maximize the delivery and/or transfer of power from the transmitter device 110 to the receiver device 120. In accordance with an exemplary embodiment, the receiver device 120 is an OLED panel 130, which provides a visual feedback or display to a user regarding alignment of the conductors of the transmitter device 110 and the receiver device 120.

Figure 2:
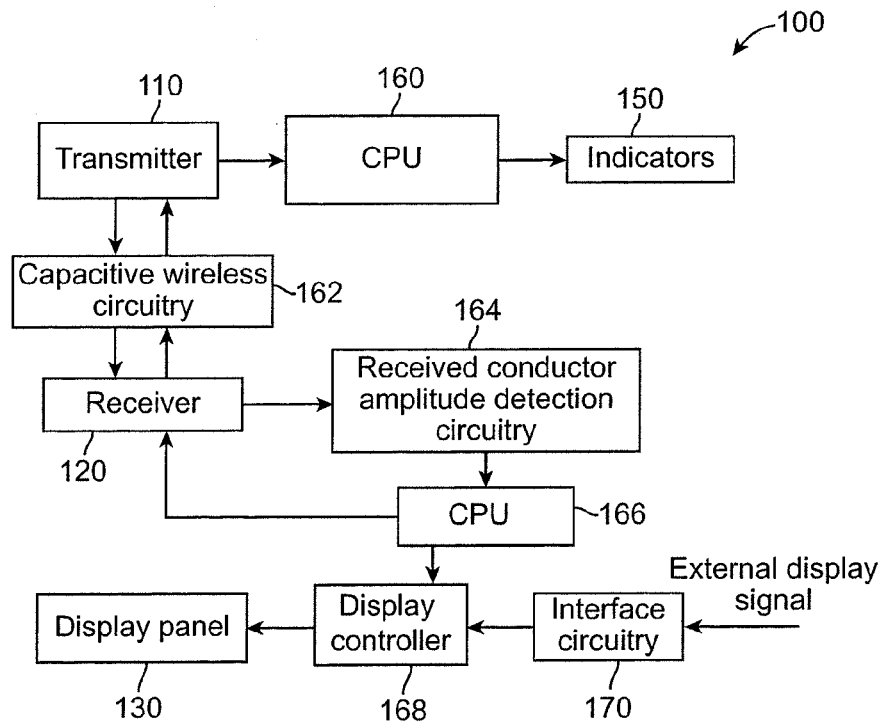
FIG. 2 is a block diagram of a system for capacitive wireless power transmission in accordance with an exemplary embodiment.

FIG. 2 is a block diagram of a system 100 for capacitive wireless power transmission in accordance with an exemplary embodiment. As shown in FIG. 2, the system 100 includes a transmitter device 110, which include a central processing unit (CPU) and/or microprocessor 160 and capacitive wireless circuitry 162. The central processing unit (CPU) and/or microprocessor 160 controls the current output of the power source (not shown) and determines the alignment of the capacitive conductors 114, 124. In addition, the CPU and/or microprocessor 160 preferably controls the illumination of one or more indicators 150 located around an outer perimeter 152 of the capacitive conductor 114 of the transmitter device 110 as more fully set forth herein. In accordance with an exemplary embodiment, the capacitive wireless circuitry 162 provides a means of capacitive wireless communication between the transmitter device 110 and the receiver device 120. In accordance with an exemplary embodiment, the receiver device 120 includes a received conductor amplitude detection circuitry 164 and a central processing unit (CPU) and/or microprocessor 166. The receiver device 120 also preferably includes a display panel 130 having a display controller 168 and interface circuitry 170, which can be configured to receive an external display signal.

Figure 3:
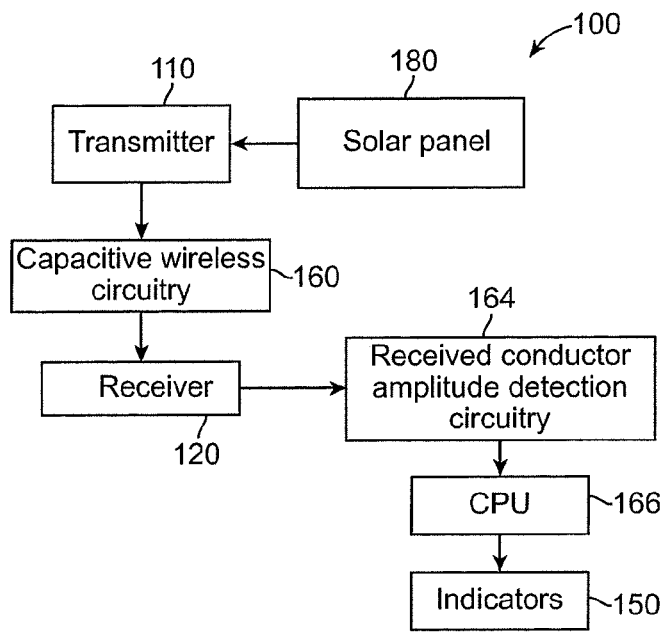
FIG. 3 is a block diagram of a system for capacitive wireless power transmission having at least one solar panel in accordance with another exemplary embodiment.

FIG. 3 is a block diagram of a system 100 for capacitive wireless power transmission having at least one solar panel 180 in accordance with another exemplary embodiment. The at least one solar panel 180 is preferably a photovoltaic module or photovoltaic panel, which is comprised of a packaged, interconnected assembly of solar cells or photovoltaic cells. As shown in FIG. 3, the system includes a transmitter device 110, which has at least one solar panel 180 thereon and/or in communication with the transmitter device 110, and a capacitive wireless circuitry 160 for capacitive wireless communication with a receiver device 120. The receiver device 120 includes a received conductor amplitude detection circuitry 164 and a central processing unit and/or microprocessor 166. The CPU and/or microprocessor 166 preferably controls the illumination of one or more indicators 150 located around an outer perimeter 152 of the capacitive conductor 114 of the transmitter device 110 as more fully set forth herein.

FIG. 4 is an illustration of transmitter device 110 in the form of a wall conductor in accordance with an exemplary embodiment. As shown in FIG. 4, the wall conductor preferably includes a capacitive conductor 114. The capacitive conductor 114 is preferably in the form of a conductive plate 116. The transmitter device 110 (or wall conductor) has an electronic circuit (not shown) having a power source (e.g., alternating current (AC current), direct current (DC current) and/or batteries), which produces an electrical field and delivers a source of power to the receiver device 120.

FIG. 5 is an illustration of a receiver device 120 in the form of an organic light emitting diode (OLED) panel 130. As shown in FIG. 5, the OLED panel 130 includes of a plurality of organic light emitting diodes (OLED) 132, which is a light-emitting diode (LED) in which the emissive electroluminescent layer is a film of organic compounds, which emit light in response to an electric current. The layer of organic semiconductor material is situated between two electrodes, the anode and cathode, which are deposited on a substrate. When an electric current is applied to the capacitive conductor 124 (i.e., anode and cathode) from the capacitive conductor 114 of the transmitter device 110, an electroluminescent light is produced from the organic material.

FIG. 6 is an illustration of the transmitter device 110 in the form of a wall conductor having an alignment indicator in the form of one or more indicators 150 located around an outer perimeter 152 of the capacitive conductor 114 of the transmitter device 110. As shown in FIG. 6, the capacitive conductor 114 has one or more indicators 150 around an outer edge or perimeter 152, which upon alignment with a corresponding capacitive conductor 124 (e.g., OLED panel 130) illuminate to provide a visual acknowledgment to the user and/or operator that the capacitive conductors 114, 124 are aligned correctly. In accordance with an exemplary embodiment, the indicators are light emitting diodes (LED) and/or like devices, which illuminate upon receiving an electrical charge.

FIG. 7 is an illustration of an alignment configuration, wherein the capacitive conductor 114 of the transmitter device (or wall conductor) 110 is correctly aligned with the OLED panel conductors. As shown in FIG. 7, the transmitter device 110 (or wall conductor) has one or more indicators 150 around an outer edge or perimeter 142 of the transmitter device 110. The one or more indicators 150 provide a visual indicator to a user and/or operator on the alignment of the capacitive conductor 114 of the transmitter device 110 and the capacitive conductor 124 of the receiver device 120.

In accordance with an exemplary embodiment, the one or more indicators 150 are connected to a central processing unit (CPU) and/or microprocessor, which receives information from the transmitter device 110 and the receiver device 120 pertaining to the area and shape of each of the capacitive conductors 114, 124 associated with the respective devices 110, 120 and upon determination that the conductors are aligned with one another, the CPU and/or microprocessor sends a signal to the one or more indicators 150 that the conductors 114, 124 are aligned with one another.

FIG. 8 is an illustration of an alignment configuration showing a transmitter device 110 in the form of a wall conductor having a plurality of conductor panels 118 and the OLED panel 130 is aligned within a center portion thereof. As shown in FIG. 8, the transmitter device 110 is comprised of a plurality of conductor panels 118, each of the plurality of conductor panels 118 having one or more indicators 150 positioned around an outer edge or perimeter thereof. In accordance with an exemplary embodiment, at least one indicator 150 is located on each outer edge of each of the plurality of conductor panels 118. The transmitter device 110 as shown in FIG. 8 is comprised of a grid of conductor panels 118 having a plurality of rows of capacitive conductors 114 (e.g., 4 rows) with a plurality of columns of capacitive conductors 114 (e.g., 7 columns). A receiver device 120 in the form of a OLED panel 130 is placed in proximity to the transmitter device 110, and upon alignment of the OLED panel 130 with the capacitive conductors 114 of the transmitter device 110, the corresponding indicators 150 around an outer edge or perimeter 152 of the OLED panel 130 on the grid or panel of capacitive conductors 118 are illuminated to indicate that the OLED panel 130 is correctly aligned with the capacitive conductors 118 of the transmitter device 110. Alternatively, as shown in FIG. 7, the one or more indicators can be initially illuminated and upon alignment of the capacitive conductors 114, 124, with one another, the one or more indicators 150 are turned off (i.e., do not receive an electrical charge) and thus, no longer illuminated.

Figure 9:
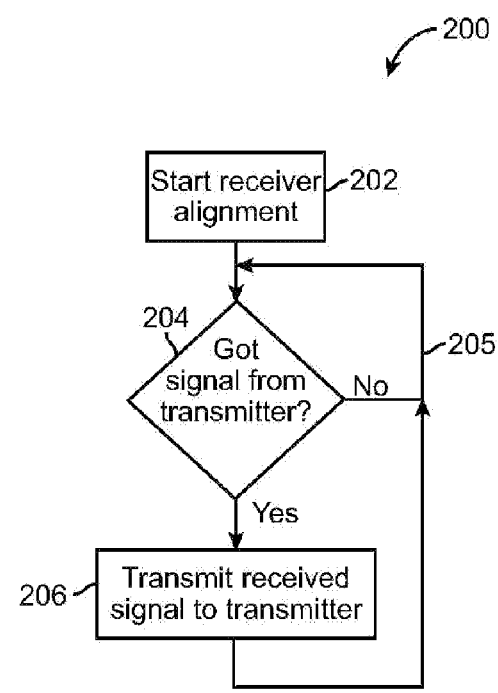
FIG. 9 is a flow chart illustrating a method of aligning a wall conductor with an OLED panel conductor in accordance with an embodiment.

FIG. 9 is a flow chart illustrating a method 200 of aligning a wall conductor with an OLED panel conductor in accordance with another embodiment. As shown in FIG. 9, in step 202, the receiver alignment system within the transmitter device or conductor panel 110 is initiated (or started) to recognize receiver devices, which are in physical proximity to the transmitter device 110. In step 204, the CPU and/or microprocessor within the transmitter device 110 determines if a signal is being received from the receiver device 120. In step 205, if no signal is received, the process returns to step 202 and the process starts over. In step 206, if a signal is received indicating that a receiver device 120 is in physical proximity to the transmitter device 110, the process for determining, if the capacitive conductor 114 of the receiver device 120 is aligned is initiated as shown in FIG. 8.

Figure 10:
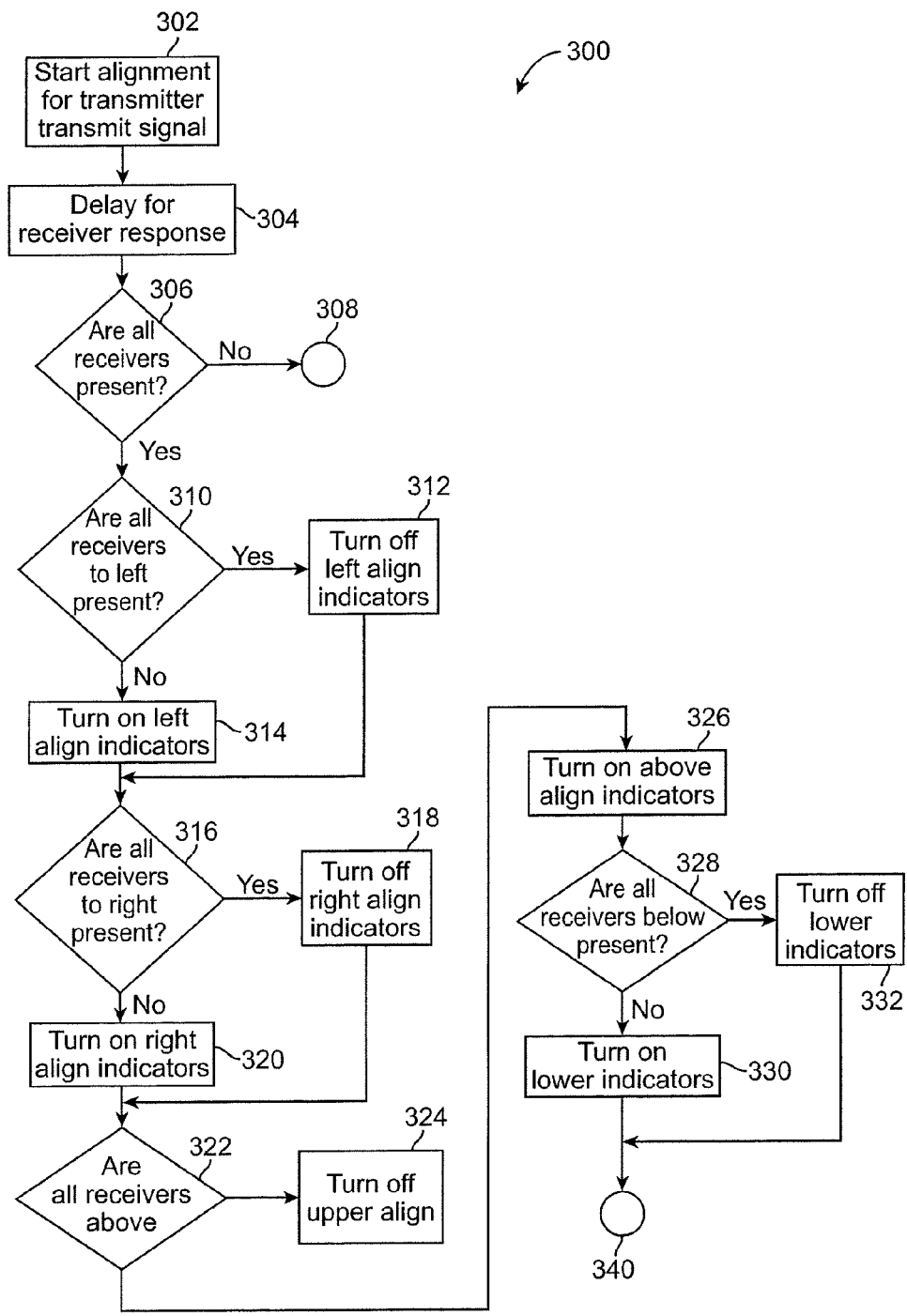
FIG. 10 is a flow chart illustrating a method of aligning a wall conductor with an OLED panel conductor in accordance with another embodiment.

FIG. 10 is a flow chart illustrating a method 300 of aligning a wall conductor 110 with a receiver device 120 in the form of an OLED panel in accordance with an exemplary embodiment. As shown in FIG. 10, if a signal is transmitted from the OLED panel (or receiver device) 120 to the wall conductor (or transmitter device 110), in step 302, the alignment process is initiated. In step 304, the wall conductor 110 waits for receipt of a signal from the receiver 120 that the capacitive conductor (i.e., OLED panel 130) is in physical proximity to the wall conductor 110 to start determining if the respective capacitive conductors 114, 124 are in alignment with one another. In step 306, if each of the capacitive conductors 124 of the receiver device 120 is present, the alignment process is initiated. If not all the receivers (i.e., capacitive conductors 124) are present, the process in step 308 is temporarily stopped until each of the receivers is present, and the process returns to step 302. In step 310, a determination is made if each of the capacitive conductors 124 on a left hand side and/or portion of the receiver device 120 is aligned with the capacitive conductor 114 of the transmitter device 110. In step 312, if the capacitive conductors 124 on the left hand side and/or portion of the receiver device are aligned with capacitive conductors of the transmitter device 110, the indicators or plurality of indicators 150 on the left side of the transmitter device 110 are deactivated. Alternatively, in step 314 if the capacitive conductors 124 on the left hand side and/or portion are not aligned, the indicators and/or plurality of indicators 150 on the left side of the transmitter device 110 remain activated. In steps 316, 322, and 328, a determination is made if each of the capacitive conductors 124 on a right hand side and/or portion, an upper or above side and/or portion, and a lower or below side and/or portion, respectively, of the receiver device 120 are aligned with the respective portion of the capacitive conductor 114 of the transmitter device 110. In steps 318, 324, 332 if the capacitive conductors 124 on the right, upper and/or lower side and/or portion of the receiver device 120 are aligned with capacitive conductors 114 of the transmitter device 110, the indicators or plurality of indicators 150 on the right, upper and/or lower side of the transmitter device are deactivated. Alternatively, in steps 320, 326, 330 if the capacitive conductors 124 on the right, upper and lower side and/or portion are not aligned with the capacitive conductor 114 of the transmitter device 110, the indicators and/or plurality of indicators 150 on the right, upper and/or lower side of the transmitter device 110 remain activated. In step 340, upon alignment of the capacitive conductors 114, 124 of the transmitter device 110 and the receiver device 120, each of the indicators and/or plurality of indicators 150 are deactivated.

Alternatively, in accordance with an alternative embodiment, rather than deactivating each of the indicators and/or plurality of indicators 150 upon aligning the capacitive conductors 114, 124 with one another, the indicators and/or plurality of indicators 150 can be activated, and if the conductors 114, 124 are not aligned, the indicators and/or plurality of indicators 150 can be activated.

Figure 11:
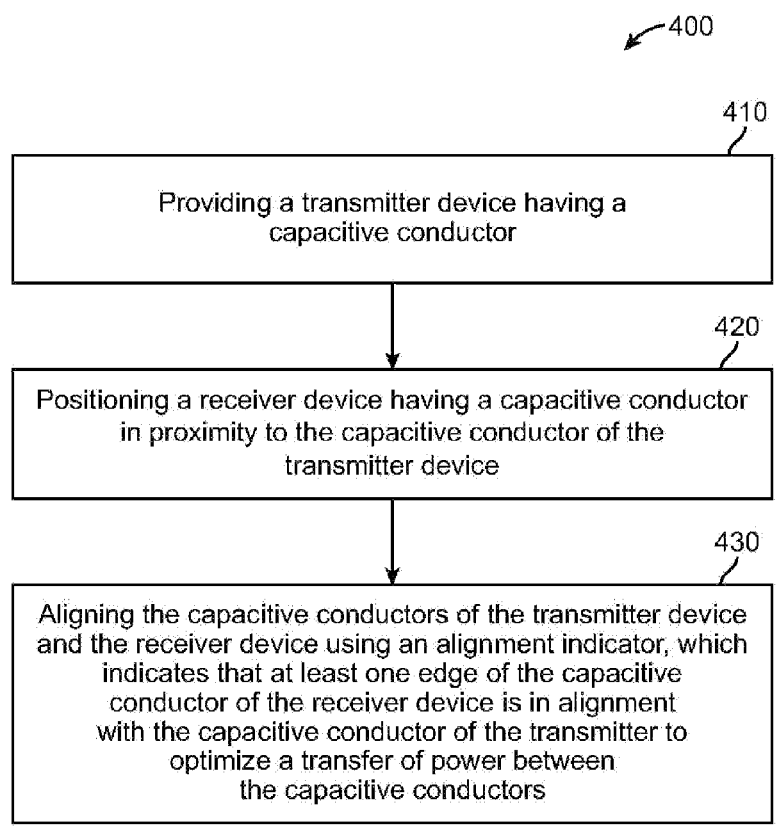
FIG. 11 is a flow chart illustrating a method of aligning a wall conductor with an OLED panel conductor in accordance with a further embodiment.

FIG. 11 is a flow chart illustrating a method 400 of aligning a wall conductor with an OLED panel conductor. In step 410, a transmitter device having a capacitive conductor is provided. In step 420, a receiver device having a capacitive conductor is positioned in proximity to the capacitive conductor of the transmitter device. In step 430, the capacitive conductors of the transmitter device and the receiver device are aligned using an alignment indicator, which indicates that at least one edge of the capacitive conductor of the receiver device is in alignment with the capacitive conductor of the transmitter to optimize a transfer of power between the capacitive conductors.

A computer program product comprising a non-transitory computer usable medium having a computer readable code embodied therein for aligning a capacitive wireless power transmission system, the process comprises: providing a first one of a transmitter device having a capacitive conductor and a receiver device having a capacitive conductor; positioning a second one of the transmitter device and the receiver device in proximity to the capacitive conductor of the first one of the transmitter device and the receiver device; and aligning the capacitive conductors of the transmitter device and the receiver device using an alignment indicator, which indicates that at least one edge of the capacitive conductor of the receiver device is in alignment with the capacitive conductor of the transmitter to optimize a transfer of power between the capacitive conductors.

The non-transitory computer usable medium, of course, may be a magnetic recording medium, a magneto-optic recording medium, or any other recording medium which will be developed in future, all of which can be considered applicable to the present invention in all the same way. Duplicates of such medium including primary and secondary duplicate products and others are considered equivalent to the above medium without doubt. Furthermore, even if an embodiment of the present invention is a combination of software and hardware, it does not deviate from the concept of the invention at all. The present invention may be implemented such that its software part has been written onto a recording medium in advance and will be read as required in operation.

It will be apparent to those skilled in the art that various modifications and variation can be made to the structure of the present invention without departing from the scope or spirit of the invention. For instance, although a system for conducting electric power from the transmitter device 110 on the wall to the OLED panel 130 as the receiver device 120 is exemplary explained above, the present invention is applicable to a system in which a solar panel as a transmitter device is to be positioned relative to a receiver device or system fixedly provided on a roof of a building. In this case, the alignment indicator can be provided any location insofar as an operator can refer to the alignment indicator while he/she is installing the solar panel. In view of the foregoing, it is intended that the present invention cover modifications and variations of this invention provided they fall within the scope of the following claims and their equivalents.

What is claimed is:

1. A method of aligning a capacitive wireless power transmission system, the method comprising:
   providing a first one of a transmitter device having a capacitive conductor and a receiver device having a capacitive conductor;
   positioning a second one of the transmitter device and the receiver device in proximity to the capacitive conductor of the first one of the transmitter device and the receiver device; and
   aligning the capacitive conductors of the transmitter device and the receiver device using an alignment indicator, which indicates that at least one edge of the capacitive conductor of the receiver device is in alignment with the capacitive conductor of the transmitter to optimize a transfer of power between the capacitive conductors.

2. The method of claim 1, wherein the transmitter device is a rectangular panel having one or more alignment indicators around a perimeter of the rectangular panel.

3. The method of claim 1, wherein the capacitive conductors of the transmitter device is a plurality of capacitive conductors, which forms a grid.

4. The method of claim 1, wherein the transmitter device is comprised of a plurality of rectangular capacitive conductors having one or more indicators around a perimeter of each of the plurality of rectangular capacitive conductors.

5. The method of claim 1, wherein the receiver device is a display panel, which is comprised of a plurality of light emitting diodes (LED).

6. The method of claim 5, wherein the light emitting diodes are organic light emitting diodes (OLED).

7. The method of claim 1, wherein upon aligning the capacitive conductors of the transmitter device and the receiver device, the indicators on the transmitter device provide a visual signal.

8. The method of claim 1, wherein the capacitive conductors of the transmitter device is a capacitive plate and the receiver device is an organic light emitting diode (OLED) panel.

9. The method of claim 1, further comprising upon alignment of the capacitive conductors, the alignment indicator provides a visual indication that the capacitive conductors are in alignment.

10. The method of claim 1, wherein the transmitter device includes at least one solar panel.

11. A capacitive wireless power transmission system, comprising:
   a transmitter device having a capacitive conductor;
   a receiver device having a capacitive conductor in proximity to the capacitive conductor of the transmitter device; and
   an alignment indicator, which indicates that at least one edge of the capacitive conductor of the receiver device is in alignment with the capacitive conductor of the transmitter to optimize a transfer of power between the capacitive conductors.

12. The system of claim 11, wherein the transmitter device is a rectangular panel having one or more alignment indicators around a perimeter of the rectangular panel.

13. The system of claim 11, wherein the capacitive conductors of the transmitter device is a plurality of capacitive conductors, which forms a grid.

14. The system of claim 11, wherein the transmitter device is comprised of a plurality of rectangular capacitive conductors having one or more indicators around a perimeter of each of the plurality of rectangular capacitive conductors.

15. The system of claim 11, wherein the receiver device is a display panel, which is comprised of a plurality of organic light emitting diodes (OLED).

16. The system of claim 11, wherein the capacitive conductors of the transmitter device is a plurality of capacitive plates and the receiver device is an organic light emitting diode (OLED) panel.

17. The system of claim 11, further comprising upon alignment of the capacitive conductors, the alignment indicator provides a visual indication that the capacitive conductors are in alignment.

18. A computer program product comprising a non-transitory computer usable medium having a computer readable code embodied therein for aligning a capacitive wireless power transmission system, the process comprising:
   providing a first one of a transmitter device having a capacitive conductor and a receiver device having a capacitive conductor;
   positioning a second one of the transmitter device and the receiver device in proximity to the capacitive conductor of the first one of the transmitter device and the receiver device; and
   aligning the capacitive conductors of the transmitter device and the receiver device using an alignment indicator, which indicates that at least one edge of the capacitive conductor of the receiver device is in alignment with the capacitive conductor of the transmitter to optimize a transfer of power between the capacitive conductors.

19. The computer program product of claim 18, wherein the transmitter device is a rectangular panel having one or more alignment indicators around a perimeter of the rectangular panel.

20. The computer program product of claim 18, wherein the capacitive conductors of the transmitter device is a plurality of capacitive conductors, which forms a grid.

21. The computer program product of claim 18, wherein the transmitter device is comprised of a plurality of rectangular capacitive conductors having one or more indicators around a perimeter of each of the plurality of rectangular capacitive conductors.

22. The computer program product of claim 18, wherein the receiver device is a display panel, which is comprised of a plurality of organic light emitting diodes (OLED).

* * * * *